(12) United States Patent
Tailliet

(10) Patent No.: US 8,363,470 B2
(45) Date of Patent: Jan. 29, 2013

(54) MEMORY DEVICE OF THE ELECTRICALLY ERASABLE AND PROGRAMMABLE TYPE, HAVING TWO CELLS PER BIT

(75) Inventor: François Tailliet, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 189 days.

(21) Appl. No.: 12/913,438

(22) Filed: Oct. 27, 2010

(65) Prior Publication Data

US 2011/0103146 A1 May 5, 2011

(30) Foreign Application Priority Data

Oct. 29, 2009 (FR) ...................................... 09 57623

(51) Int. Cl.
*G11C 16/06* (2006.01)

(52) U.S. Cl. ......... 365/185.07; 365/185.01; 365/185.26; 365/154; 365/49.11

(58) Field of Classification Search ............. 365/185.07, 365/185.01, 185.26, 154, 49.11
See application file for complete search history.

(56) References Cited

U.S. PATENT DOCUMENTS

2006/0158925 A1 * 7/2006 Cuppens ....................... 365/154

FOREIGN PATENT DOCUMENTS

FR 2663147 12/1991

* cited by examiner

*Primary Examiner* — Thong Q Le
(74) *Attorney, Agent, or Firm* — Allen, Dyer, Doppelt, Milbrath & Gilchrist, P.A.

(57) ABSTRACT

The memory device includes a memory cell unit of the electrically erasable and programmable non-volatile type including two memory cells respectively connected to two bit lines via two bit line select transistors. The common terminal between the bit line select transistor and the floating-gate transistor of each memory cell of the memory cell unit is connected to the control gate of the floating-gate transistor of the other memory cell of the memory cell unit.

16 Claims, 4 Drawing Sheets

MEMORY DEVICE OF THE ELECTRICALLY ERASABLE AND PROGRAMMABLE TYPE, HAVING TWO CELLS PER BIT

FIELD OF THE INVENTION

The invention relates to memories, in particular to memories of the electrically erasable and programmable non-volatile (EEPROM) type having two cells per bit.

BACKGROUND OF THE INVENTION

In EEPROM memories, the logic value of a bit stored in a memory cell is represented by the value of the threshold voltage of a floating-gate transistor, which can be modified at will by erasing or programming operations. The programming or erasing of a floating-gate transistor includes injecting electrical charges into the gate of a transistor, or extracting electrical charges therefrom, through the tunnel or Fowler-Nordheim effect via a programming/erase voltage Vpp that may be around 10 to 20 volts.

To read such a memory cell, the threshold voltage of the transistor is compared with a reference voltage which, in general, is substantially midway between the negative threshold voltage of a programmed transistor and the positive threshold voltage of an erased transistor. In practice, this comparison is made by applying a read voltage substantially equal to the reference voltage on the gate of the transistor and then observing whether the transistor is in the on-state or the off-state. The on-state or off-state of the transistor is detected by a read circuit commonly referred to by those skilled in the art as a "sense amplifier" connected to the bit line to which the floating-gate transistor is itself connected. During this read process, an erased transistor remains in the off-state since its threshold voltage is above the read voltage. In this way, no current can flow in the bit line and this corresponds to a first logic state of the bit stored in the cell, for example a bit of logic value zero.

A programmed transistor is, on the contrary, in the on-state since its threshold voltage is below the read voltage. In this case, a current flows in the bit line and this corresponds by convention to a bit having the opposite logic value, for example the logic value 1. Conventional architectures of EEPROM memory cell units are illustrated in FIGS. 1 and 2. More precisely, in FIG. 1, the memory cell unit MCU is made up of a memory cell CEL comprising a transistor FGT having a control gate CG and a floating gate FG. The cell CEL is connected to a bit line BL via a bit line select transistor BLST.

The cell also includes a control gate select transistor CGST connected between a gate control line GCL and the control gate CG of the floating-gate transistor FGT. The gates of the transistors COST and BLST are connected to a word line WL conventionally extending perpendicular to the bit line BL. The architecture in FIG. 1 therefore provides one memory cell per bit. To erase the cell, the programming voltage Vpp is applied on the word line WL and on the gate control line GCL, whereas a zero voltage is applied on the terminal GND connected to the source of the transistor FGT, the bit line BL generally being left floating.

In writing, the programming voltage is applied on the word line WL while a zero voltage is applied on the line GCL. To write a "1" (for example), the programming voltage Vpp is applied on the bit line BL, whereas this bit line BL is left floating to write a "0". In both cases, the terminal GND is floating.

In general, words of x bits, typically 8 bits, forming in this case eight-bit bytes, are stored in the EEPROM memory. Typically, the storage zone of an eight-bit byte therefore comprises eight memory cell units plus one control gate select transistor CGST (since in general the control gates of the eight memory cells of the eight memory cell units are all connected together and selected from the line GCL) and a ground line. Programming an eight-bit byte is therefore made up of an overall word erase cycle followed by a selective write cycle.

To improve the reliability of memory cell units, it is possible to use architectures having two cells per logic bit, as illustrated in FIG. 2. The logic state "1" or "0" of a bit, or logic bit, is then represented by two data bits. The purpose of such architectures is to maintain data integrity if one of the paired memory cells is out of action. With such architectures, it is possible to store a binary data bit twice or else, as illustrated in FIG. 2, one binary data bit in one of the memory cells and the complementary binary data bit in the other memory cell.

More precisely, a memory plane MP having two cells per bit comprises in this case two memory cells CEL1 and CEL2 each having a bit line select transistor BLST1, BLST2 and a floating-gate transistor FGT1, FGT2. A single control gate select transistor CGST is provided for controlling the two control gates CG1, CG2 of the transistors FGT1, FGT2. With such an architecture, an eight-bit byte therefore typically comprises 16 memory cells plus one control gate select transistor CGST.

To be able to program more rapidly, for example, to reduce the programming time by a factor of two, it is possible to provide an individual control gate select transistor per memory cell, so that each memory cell can be individually erased. Thus, it is possible to simultaneously erase certain cells and to write others. With such an architecture, an eight-bit byte therefore comprises 16 memory cells and 16 control gate select transistors. Moreover, each memory cell must have a dedicated ground line, which results in a total of 16 ground lines.

Another approach, enabling two cells per bit to be combined and with simultaneous electrical erasing, could include, in the case of an eight-bit byte, reproducing the architecture of FIG. 2 eight times, which therefore results in 16 memory cells, 8 control gate select transistors and 8 ground lines, since one ground line is dedicated per pair of cells. Thus, whatever the option chosen, storing a digital word with two cells per bit, while being able to erase and write simultaneously, is costly in terms of area.

SUMMARY OF THE INVENTION

According to one embodiment, a memory device is consequently proposed that makes it possible to combine storage of a bit on two cells per bit with simultaneous erasing and writing of bits of a stored digital word, for example, an eight-bit byte, i.e. with a single programming cycle and with a substantial space saving.

According to another embodiment, a memory device is also provided that offers more uniform, simpler and more compact decoding. Thus, according to one aspect, what is provided is a memory device comprising at least one memory plane of the electrically erasable and programmable non-volatile type comprising two memory cells respectively connected to two bit lines via two bit line select transistors.

According to a general feature of this aspect, the common terminal between the bit line select transistor and the floating-gate transistor of each memory cell of the memory plane is connected to the control gate of the floating-gate transistor of the other memory cell of the memory cell unit. Thus, the bit line select transistor of one memory cell serves as control gate select transistor for the other memory cell, and vice versa. This therefore dispenses with a specific control gate select transistor, which is present in conventional EEPROM memory cell unit architectures.

According to one embodiment, a binary data unit and the complementary binary data unit are stored in such a memory plane, and the two electrodes or terminals of the two floating-gate transistors, for example, their sources, which are opposite the two common terminals, are connected to two separate ground terminals respectively. Moreover, the connection between said common terminal and the control gate of the floating-gate transistor of the other memory cell of the memory plane is advantageously a direct connection, namely without intermediate element.

According to one embodiment, the two memory cells are placed facing each other, back to back. The two floating-gate transistors being mutually offset so as to avoid any crossover between the internal interconnects of the memory cell unit.

According to one embodiment, to ensure, on the one hand, continuity of a word line produced in polysilicon and, on the other hand, connection between the state transistor (floating-gate transistor) of a memory cell and the corresponding ground line, the two electrodes or terminals of the two floating-gate transistors, which are opposite the two common terminals, are connected to the two separate ground terminals via two auxiliary transistors respectively. Each auxiliary transistor has its source and its drain connected. The gate of one auxiliary transistor associated with one memory cell is connected to the gate of the bit line select transistor of the other memory cell, and vice versa.

According to one embodiment, the device further includes a memory latch (or programming latch) connected to the two bit lines and having a structure which is completely symmetrical relative to the two bit lines. In other words, such a completely symmetrical memory latch controls the two bit lines of the paired cells. There is therefore no longer any need to provide memory latches dedicated to controlling the control gates, which latches are present in conventional EEPROM architectures.

According to one embodiment, the device comprises a matrix memory plane comprising several memory cell units, all the bit lines being formed by first lines extending along a first direction and the gates of the bit line select transistors of the memory cell units are connected to second lines, usually called "word lines", extending along a second direction.

BRIEF DESCRIPTION OF THE DRAWINGS

Other advantages and features of the invention will become apparent from the detailed description of entirely non-limiting embodiments and the appended drawings in which.

DETAILED DESCRIPTION OF THE PREFERRED EMBODIMENTS

Figure 1:
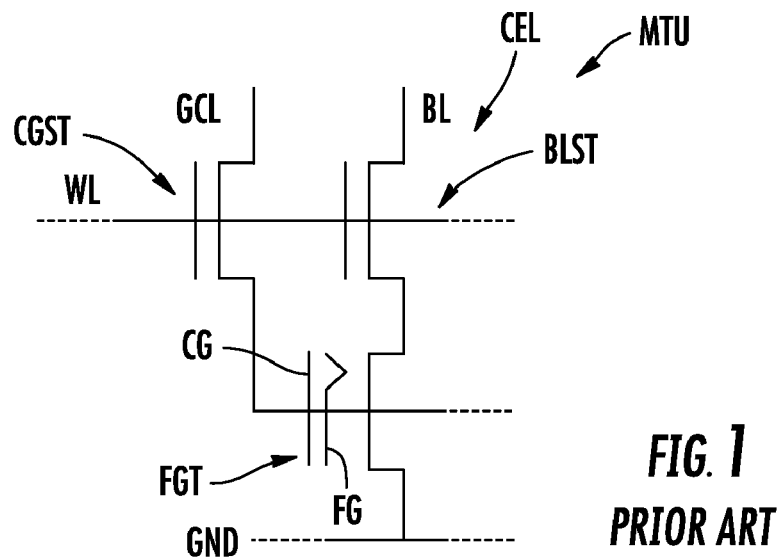
FIGS. 1 and 2, already described, are schematic diagrams illustrating conventional architectures of EEPROM memory cell units according to the prior art.
Figure 2:
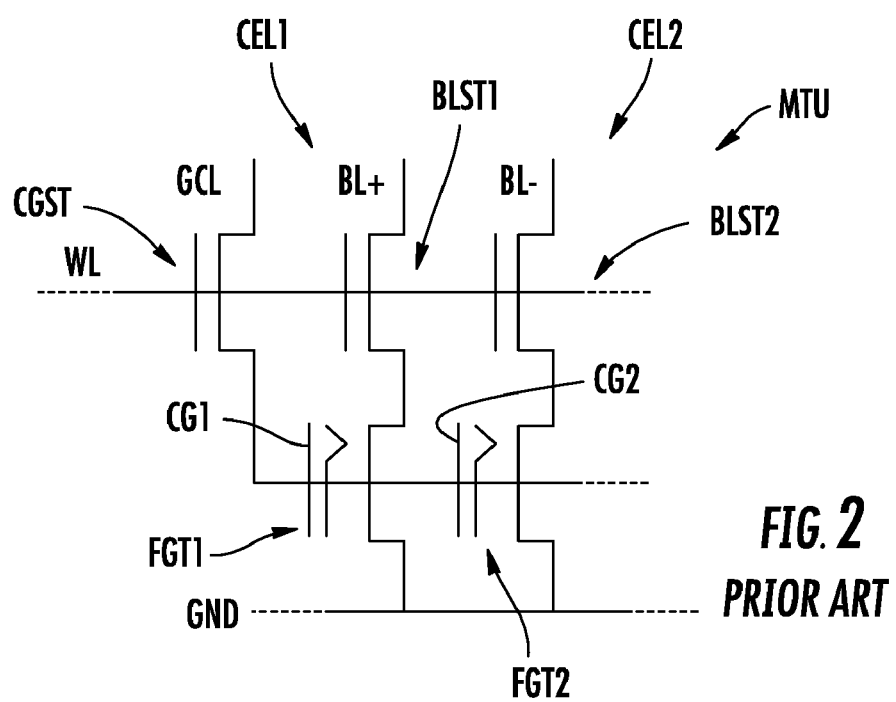
Figure 3:
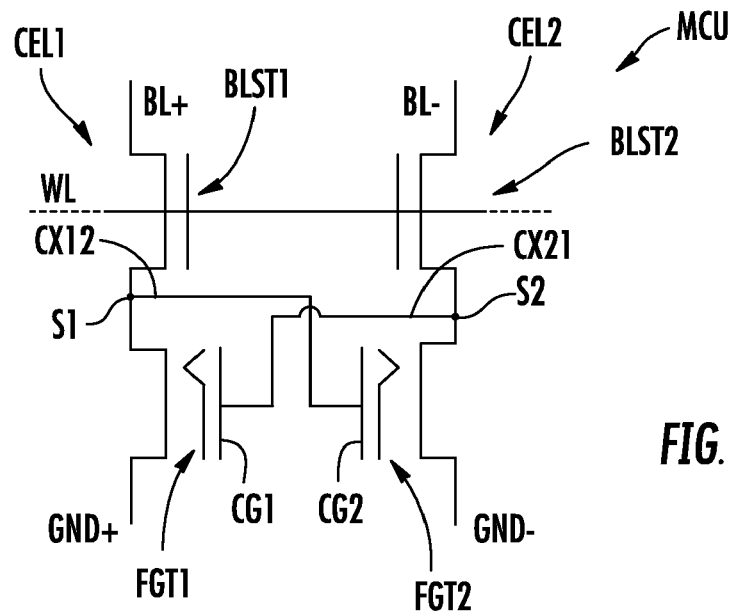
FIGS. 3 and 4 are schematic diagrams illustrating two embodiments of a memory cell unit according to the invention.

In FIG. 3, the reference MCU denotes a differential EEPROM memory cell unit, i.e. one intended for storing a binary data unit and its complement, of the type having two cells per bit. More precisely, this memory cell unit MCU comprises a first memory cell CEL1 and a second memory cell CEL2.

The first memory cell CEL1 comprises a state transistor or floating-gate transistor FGT1 and a bit line select transistor BLST1, enabling the cell CEL1 to be connected to the bit line BL+. Likewise, the second memory cell CEL2 comprises a floating-gate state transistor FGT2 connected to the bit line BL− via a bit line select transistor BLST2.

The source of the bit line select transistor BLST1 also forms the drain of the transistor FGT1 and this common terminal, referenced S1, is connected to the control gate CG2 of the transistor FGT2 via an interconnect CX12. Likewise, the common terminal S2 (the source of the transistor BLST2 and the drain of the transistor FGT2) is connected to the control gate CG1 of transistor FGT1 via an interconnect CX21.

Since the memory cell unit is differential, the other two electrodes or terminals of the two floating-gate transistors, in this case their sources, are connected to two separate ground terminals GND+ and GND− respectively. Finally, the gates of the two bit line select transistors BLST1 and BLST2 are connected to a word line WL. It may therefore be seen that, with such an architecture, the bit line select transistor of one cell serves as a control gate select transistor for the other cell, and vice versa. This therefore results in a substantial space saving.

Moreover, assuming for example that a programmed logic "0" bit corresponds to the programming of two binary data units (1,0) and that a programmed logic "1" bit corresponds to the programming of two binary data units (0,1), the following procedures are carried out to write a logic "0" bit, (corresponding to erasure of the memory cell unit): the bit line BL− is generally left floating; a programming voltage Vpp is applied on the word line WL and on the bit line BL+, while a zero voltage is applied on the ground terminal GND−; and the ground terminal GND+ is left floating.

To write a logic "1" bit, the programming voltage Vpp is applied on the word line WL and on the bit line BL−, while the zero voltage is applied on the bit line BL+ and on the ground terminal GND+; the ground terminal GND− is left floating. It may therefore be seen that a memory cell unit can receive a write or erase stimulus. Thus, in the case of storing a word comprising several bits on several memory cell units MCU respectively, the memory unit cell units may be individually written and erased. In other words, it is possible, simultaneously, i.e. during a single programming cycle, to program certain memory cell units with a word and to erase others.

To read a memory cell unit MCU, a zero voltage is applied to their ground terminals GND+ and GND−. Thus, storing an eight-bit byte requires 16 memory cells including, of course, 16 bit line select transistors, but no additional specific control gate select transistor.

Figure 4:
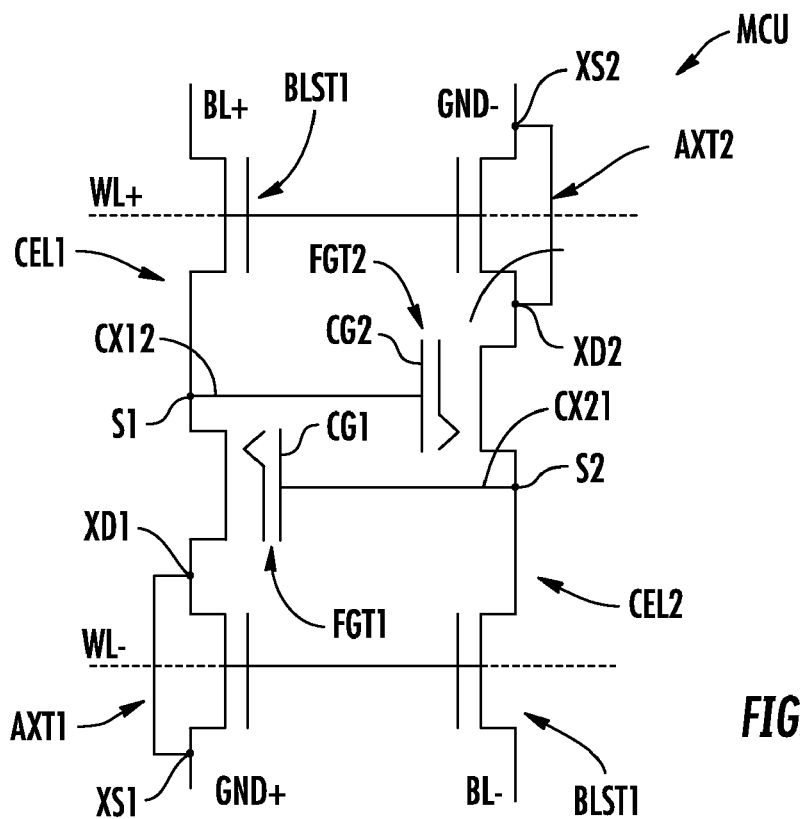
Figure 5:
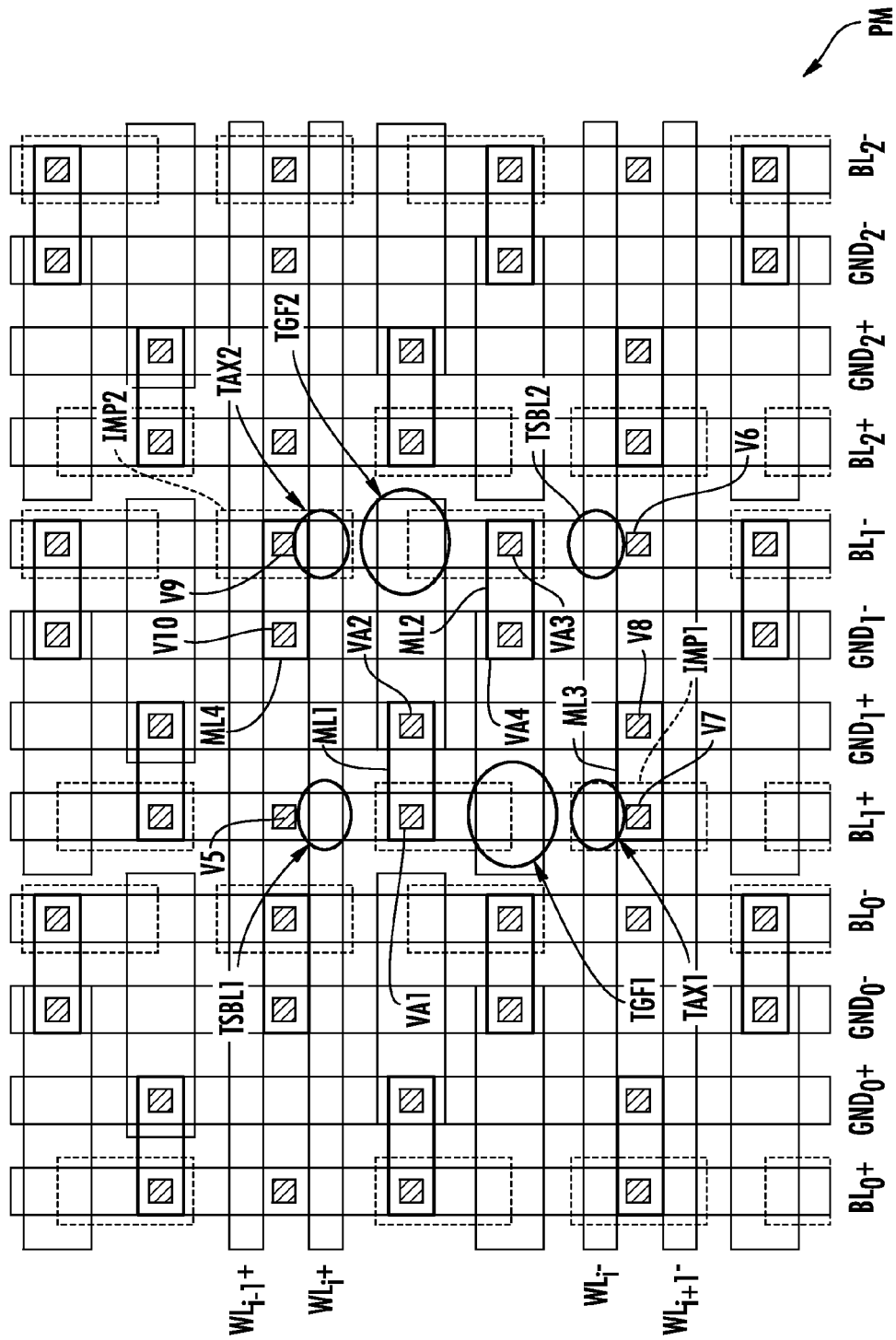
FIG. 5 is a schematic diagram illustrating one example of a lay-out of a memory plane according to the invention.

In the embodiment shown in FIG. 4, the two memory cells CEL1 and CEL2 are placed facing each other, back to back, and the two floating-gate transistors FGT1 and FGT2 are mutually offset so as to avoid any crossover between the internal interconnects CX12 and CX21 of the memory cell unit MCU. This makes it easier to produce the lay-out of a memory plane MP, one representative example of which is illustrated in FIG. 5. In this lay-out, the memory plane PM comprises horizontal polysilicon lines forming word lines $WL_i+$, $WL_i-$ and vertical metallizations forming the bit lines $BL_j+$ and $BL_j-$.

Assuming in this example that the memory cell unit MCU of FIG. 4 is that found at the intersection of the word lines WL$_i$+, WL$_i$− and the bit lines BL$_1$+ and BL$_1$−. Thus, it may be seen, that because of the slightly offset back-to-back arrangement of the memory cells, the common termainl S1 (the source of the transistor BLST1 and the drain of the transistor FGT1) is easily connected to the control gate of the transistor FGT2 via two contacts VA1 and VA2 mutually connected by a metallization ML1 located here at metal level 1. Likewise, the common terminal between the transistor FGT2 and the transistor BLST2 is connected to the control gate of the transistor FGT1 via two contacts VA3 and VA4 mutually connected by a metallization ML2, again located at metal level 1.

Moreover, to ensure continuity of the polysilicon word lines WL$_i$+ and WL$_i$− and also connection between the corresponding floating gate transistor and the ground lines GND$_1$+ and GND$_1$−, provision is made (see FIG. 4) for the two electrodes of the two floating-gate transistors FGT1 and FGT2, which are opposite said common terminals S1 and S2, to be connected to the two ground terminals GND+ and GND− via two auxiliary transistors AXT1 and AXT2, respectively, each auxiliary transistor having its source XS1, XS2 and its drain XD1, XD2 respectively connected. Moreover, the gate of an auxiliary transistor associated with a memory cell is connected to the gate of the bit line select transistor of the other memory cell, and vice versa.

FIG. 5 shows that the short-circuiting of the source XS1 of the auxiliary transistor AXT1 with its drain XD1 is achieved by a specific semiconductor implantation IMP1 into the semiconductor substrate. The same applies to the specific implantation IMP2 carried out in the substrate, which enables the source XS2 and the drain XD2 of the auxiliary transistor AXT2 to be short-circuited.

Moreover, the source XS1 of the transistor AXT1 is connected to the ground line GND$_1$+ via a contact V7 and a via V8 that are connected by a metallization ML3 located at metal level 1. Likewise, the source XS2 of the transistor AXT2 is connected to the dedicated ground line GND$_1$− through a contact V9 and a via V10 that are connected by a metallization ML4, which again is located at metal level 1. The ground lines GND$_1$+ and GND$_1$− here are in fact metallizations located at metal level 2. Finally, the drain of the bit line select transistor BLST1 is connected to the bit line BL$_1$+ located at metal level 2 by a connection V5 comprising a contact, a metallization portion located at metal level 1 and a via, whereas the drain of the transistor BLST2 is connected to the bit line BL$_1$− located at metal level 2 by a connection V6 comprising a contact, a metallization portion located at metal level 1 and a via.

Figure 6:
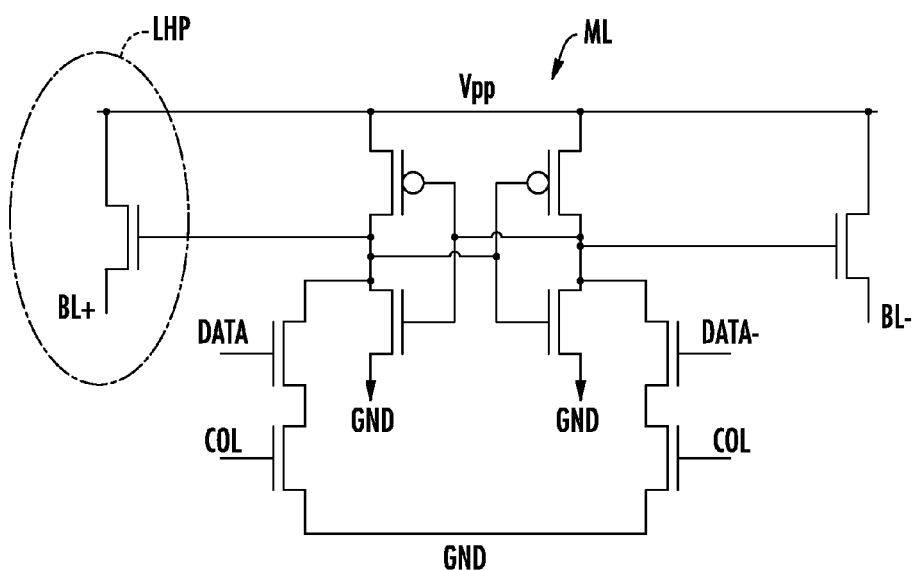
FIG. 6 is a schematic diagram illustrating one embodiment of a bit line memory latch according to the invention.

Each bit line of each column is connected to a common programming line via a programming latch ML (FIG. 6). Each programming latch ML has two inputs, namely Data and Data−, for receiving the binary data units that have to be recorded in a memory cell unit, and also a column select signal COL.

The central part and the right-hand part of FIG. 6 illustrate a conventional architecture of a memory latch ML. The left-hand part LHP, which is circled, illustrates a modification of the latch according to the invention. This figure therefore shows that the left-hand part LHP, which comprises a transistor connecting the programming voltage Vpp to the bit line BL+ with a transistor, is strictly identical to the right-hand part of the latch. The architecture of this latch ML is therefore completely symmetrical relative to the two bit lines BL+ and BL−. Its structure is considerably simplified compared with a structure of the prior art and the memory latches specifically associated with the control gate select transistors of conventional memory cell architectures no longer exist since these specific control gate select transistors no longer exist in the memory cell units according to the invention.

That which is claimed is:

1. A memory device comprising:
   an electrically erasable and programmable non-volatile type memory cell unit comprising a pair of memory cells each including
   a floating-gate transistor having a control gate,
   a bit line select transistor, and
   a common terminal coupling the bit line select transistor and the floating-gate transistor;
   the common terminal of one memory cell of the pair of memory cells being connected to the control gate of the floating-gate transistor of the other memory cell of the pair of memory cells.

2. The memory device according to claim 1, wherein terminals of the floating-gate transistors, which are opposite the common terminals, are connected to respective reference voltage terminals.

3. The memory device according to claim 1, wherein the memory cells are positioned adjacent each other with the respective floating-gate transistors being mutually offset so as to avoid any crossover between internal interconnects thereof.

4. The memory device according to claim 2, further comprising a pair of auxiliary transistors; wherein the terminals of the floating-gate transistors, which are opposite the common terminals, are connected to the respective reference voltage terminals via the auxiliary transistors respectively, each auxiliary transistor having its source and its drain connected, the gate of the auxiliary transistor associated with a corresponding memory cell being connected to the gate of the bit line select transistor of the other memory cell.

5. The memory device according to claim 1, further including a memory latch connected to the two bit lines and having a symmetrical structure relative to the two bit lines.

6. The memory device according to claim 1, wherein the at least one electrically erasable and programmable non-volatile type memory cell unit comprises a plurality of memory cell units defining a matrix memory plane (MP) including word lines; the bit lines extending along a first direction and the gates of the bit line select transistors of the memory cell units being connected to word lines extending along a second direction transverse to the first direction.

7. A memory device comprising:
   a memory cell unit comprising a pair of memory cells each including
   a floating-gate transistor having a control gate,
   a bit line select transistor, and
   a common terminal coupling the bit line select transistor and the floating-gate transistor;
   the common terminal of one memory cell of the pair of memory cells being connected to the control gate of the floating-gate transistor of the other memory cell of the pair of memory cells.

8. The memory device according to claim 7, wherein the floating-gate transistors include terminals opposite the common terminals, and connected to respective reference voltages.

9. The memory device according to claim 8, further comprising a pair of auxiliary transistors; wherein the terminals of the floating-gate transistors, which are opposite the common terminals, are connected to the respective reference voltage terminals via the auxiliary transistors respectively, each auxiliary transistor having its source and its drain connected, the gate of the auxiliary transistor associated with a corresponding memory cell being connected to the gate of the bit line select transistor of the other memory cell.

10. The memory device according to claim 7, wherein the memory cells are positioned adjacent each other with the respective floating-gate transistors being mutually offset so as to avoid any crossover between internal interconnects thereof.

11. The memory device according to claim 7, wherein the memory cell unit comprises a plurality of memory cell units defining a matrix memory plane (MP) including bit lines and word lines; the bit lines extending along a first direction and the gates of the bit line select transistors of the memory cell units being connected to word lines extending along a second direction transverse to the first direction.

12. A method of making a memory device comprising:
    forming a memory cell unit comprising a pair of memory cells each including
        a floating-gate transistor having a control gate,
        a bit line select transistor, and
        a common terminal between the bit line select transistor and the floating-gate transistor,
        the common terminal of one memory cell of the pair of memory cells being connected to the control gate of the floating-gate transistor of the other memory cell of the pair of memory cells.

13. The method according to claim 12, wherein the floating-gate transistors include terminals opposite the common terminals, and connected to respective reference voltage terminals.

14. The method according to claim 12, further comprising:
    connecting the terminals of the floating-gate transistors, which are opposite the common terminals, to the respective reference voltage terminals via respective auxiliary transistors, each auxiliary transistor having its source and its drain connected; and
    connecting the gate of the auxiliary transistor associated with a corresponding memory cell to the gate of the bit line select transistor of the other memory cell.

15. The method according to claim 12, wherein forming the memory cell unit comprises positioning the memory cells adjacent each other with the respective floating-gate transistors being mutually offset so as to avoid any crossover between internal interconnects thereof.

16. The method according to claim 12, further comprising providing a plurality of memory cell units to define a matrix memory plane (MP) including bit lines and word lines; the bit lines extending along a first direction and the gates of the bit line select transistors of the memory cell units being connected to word lines extending along a second direction transverse to the first direction.

* * * * *